(12) United States Patent
Kaneko

(10) Patent No.: US 6,604,273 B1
(45) Date of Patent: Aug. 12, 2003

(54) METHOD OF MANUFACTURING AN OXIDE SUPERCONDUCTING WIRE

(75) Inventor: Norio Kaneko, Atsugi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/672,315

(22) Filed: Sep. 29, 2000

Related U.S. Application Data

(62) Division of application No. 08/528,538, filed on Sep. 14, 1995.

(30) Foreign Application Priority Data

Sep. 30, 1994 (JP) ............................................. 6-259623
Sep. 30, 1994 (JP) ............................................. 6-259626

(51) Int. Cl.$^7$ ............................................. H01L 39/24
(52) U.S. Cl. ......................... 29/599; 174/125.1; 505/1; 505/704; 505/740
(58) Field of Search ............................... 29/599; 505/1, 505/704, 740; 174/125.1

(56) References Cited

U.S. PATENT DOCUMENTS

| | | | |
|---|---|---|---|
| 5,063,200 A | 11/1991 | Okada et al. ................... | 505/1 |
| 5,071,826 A | 12/1991 | Anderson et al. ............... | 505/1 |
| 5,082,826 A | 1/1992 | Ferrando ........................ | 505/1 |
| 5,106,825 A | 4/1992 | Mandigo et al. ................ | 505/1 |
| 5,110,789 A | 5/1992 | Yamaguchi et al. ............. | 505/1 |
| 5,202,307 A | 4/1993 | Hayashi .......................... | 505/1 |
| 5,204,315 A | 4/1993 | Ito et al. ......................... | 505/1 |
| 5,418,214 A | 5/1995 | Toreki et al. ................... | 505/125 |
| 5,424,282 A | 6/1995 | Yamamoto et al. ............. | 505/433 |
| 5,470,821 A | 11/1995 | Wong et al. ..................... | 505/236 |
| 5,508,257 A | 4/1996 | Sibata et al. ................... | 505/542 |
| 5,512,538 A | 4/1996 | Den et al. ....................... | 505/126 |
| 5,512,542 A | 4/1996 | Den et al. ....................... | 505/125 |
| 5,545,613 A | 8/1996 | Yurek et al. .................... | 505/430 |
| 5,552,370 A | 9/1996 | Anderson et al. .............. | 505/124 |
| 5,578,554 A | 11/1996 | Akimitsu et al. ................ | 505/125 |
| 5,607,658 A | 3/1997 | Kaneko et al. ................ | 423/593 |

FOREIGN PATENT DOCUMENTS

| | | |
|---|---|---|
| EP | 0 281 474 | 9/1988 |
| EP | 0 282 286 | 9/1988 |
| EP | 0 291 221 | 11/1988 |
| EP | 0 351 203 | 1/1990 |
| EP | 0 510 806 | 10/1992 |
| EP | 0 555 971 | 8/1993 |
| EP | 0 576 284 | 12/1993 |
| FR | 2 615 651 | 11/1988 |
| JP | 63-241826 | 10/1988 |
| JP | 1-140520 | 6/1989 |
| JP | 1-161612 | 6/1989 |
| JP | 1-176608 | 7/1989 |
| JP | 1-251514 | 10/1989 |
| JP | 1-276516 | 11/1989 |
| JP | 2-37623 | 2/1990 |
| JP | 02-376623 | * 2/1990 |

(List continued on next page.)

OTHER PUBLICATIONS

Patent Abstracts of Japan, vol. 14, No. 45, Jan. 26, 1990 (corresponds to JP–127656).

P.R. Slater et al., "$BO_3^{3-}$-substitutions in phases related to $YBa_2Cu_3O_7$. Superconducting properties of (Y,Ca) (Ba, Sr)$_2$Cu$_{3-z}$(BO$_3$)$_z$O$_y$," 215 Physica C 191–194 (1993).

Primary Examiner—Carl J. Arbes
(74) Attorney, Agent, or Firm—Fitzpatrick, Cella, Harper & Scinto

(57) ABSTRACT

A manufacturing method for a superconducting wire which is a fine line made of an oxide superconductor, including the steps of forming the fine line by drawing a metal pipe filled with materials for the oxide superconductor, causing the materials to react to produce the oxide superconductor, heating the metal pipe at a temperature which is higher than the melting point of the metal material constituting the metal pipe.

18 Claims, 4 Drawing Sheets

FOREIGN PATENT DOCUMENTS

| | | | |
|---|---|---|---|
| JP | 02-230612 | * | 9/1990 |
| JP | 3-37105 | | 2/1991 |
| JP | 03-216919 | * | 9/1991 |
| JP | 4-181613 | | 6/1992 |
| JP | 04-262310 | * | 9/1992 |
| JP | 0 281 444 B1 | | 12/1992 |
| JP | 05-101726 | * | 4/1993 |
| JP | 5-166426 | | 7/1993 |

* cited by examiner

METHOD OF MANUFACTURING AN OXIDE SUPERCONDUCTING WIRE

This application is a division of Application Ser. No. 08/528,538, filed Sep. 14, 1995.

BACKGROUND OF THE INVENTION

1. Field of the Invention

The present invention relates to a superconducting wire employing an oxide superconductor and a manufacturing method for the same.

2. Description of the Related Art

Oxide superconductors of Y base, Bi base, etc. exhibit superconductivity at a temperature above the boiling point of liquid nitrogen. According to a typical method for forming such a material into a wire, a superconducting material or a material therefor is charged in a metal pipe and subjected to wire drawing, then the charged material is subjected to heat treatment before and after the wire drawing as necessary. As an alternative, an oxide superconductor is formed on a substrate by various thin film forming means such as sputtering. The method wherein a superconductor is charged in a metal pipe has been disclosed in Japanese Patent Laid-Open No. 2-37623 and Japanese Patent Laid-Open No. 1-276516. The method which employs a thin film has been disclosed in Japanese Patent Laid-Open No. 63-241826.

These methods, however, have the following problems: the superconductivity of an oxide superconductor varies depending on the amount of oxygen in the materials; therefore, the amount of oxygen in the materials must be controlled to produce the wire from the superconductor. A superconducting wire is usually provided with a stabilizing material which is normally a metal such as copper. In the case of an oxide superconductor, however, copper is oxidized during the manufacturing process due to the oxygen which is present in the superconductor; therefore, copper cannot be used for the stabilizing material. Further, an oxide superconductor does not have the workability that metals have, preventing crystal grains from deforming easily. This sometimes causes a metal pipe filled with the superconductor material to break during a rolling process or a stretching process which employs dies. In addition, the oxide superconductor must be densely and uniformly charged in the metal pipe to produce usable superconducting wire. There is still another problem: the coefficient of thermal expansion of metal is different from that of an oxide superconductor, presenting a serious problem of adhesion between the metal and the oxide superconductor when they are cooled.

To solve the problems stated above, according to Japanese Patent Laid-Open No. 2-37623, an aluminum pipe is filled with an oxide superconductor and the aluminum is melted and removed before they are heated to sinter the superconductor, then they are subjected to heat treatment at 900 to 1000 degrees centigrade with the oxide superconductor exposed so as to control the amount of oxygen in the material. According to Japanese Patent Laid-Open No. 1-276516, a compact of an oxide superconductor is inserted in a silver pipe and silver powder is charged in the gap between the silver pipe and the superconductor to secure the adhesion between the metal pipe and the superconductor.

According to the method disclosed in Japanese Patent Laid-Open No. 2-37623, however, the melting point of aluminum is approximately 660 degrees centigrade and therefore, the aluminum is very likely to be oxidized by the oxygen present in the oxide superconductor before the aluminum is removed from the surface of the oxide superconductor. It is especially difficult to remove the aluminum which is in a recessed spot of the surface or in a grain boundary of the oxide superconductor; an aluminum oxide generated by oxidation tends to precipitate as an impurity or to react with the oxide superconductor in some cases. Further, the Japanese Patent Laid-Open No. 2-37623 has not disclosed anything about the formation of a stabilizing material which is indispensable for the application to superconductive magnet or the like. According to the method disclosed in the Japanese Patent Laid-Open No. 1-276516, no device has been made to improve the critical current of superconducting wire although the presence of silver powder seems to improve the adhesion between the metal pipe and the oxide superconductor.

According to the method disclosed in the Japanese Patent Laid-Open No. 63-241826 which employs the thin film forming process, the wire is produced beforehand and a thin film composed of the elements for superconducting materials is formed on a substrate, which has copper or a copper alloy deposited on the surface thereof, prior to the heat treatment. It has been disclosed, however, that the heat treatment must be carried out at 800 to 1000 degrees centigrade for 1 to 100 hours, depending on the type of superconducting material used. The method requiring such an extended heat treatment presents a problem of extremely slow manufacture, whereas quicker manufacture of superconducting wire is generally desirable. Moreover, the thin film producing method requires precise control of the composition of the elements constituting the superconductor; a slight change in the composition results in a significant change in the superconductive characteristics, posing a fatal problem in that a lengthy superconducting wire cannot be produced.

Thus, although much study has been done on the manufacture of superconducting wire which employs an oxide superconductor, no superconducting wire for practical use has been available yet.

SUMMARY OF THE INVENTION

Accordingly, it is an object of the present invention to provide a practical superconducting wire which uses an oxide superconductor with high critical temperature to prevent the critical temperature and the critical current from dropping during the manufacturing process and a manufacturing method for the same.

To this end, according to one aspect of the present invention, there is provided a superconducting wire having a fine line made of an oxide superconductor which has a metal material dispersed therein, the outer periphery thereof being coated with a conductive material.

According to another aspect of the present invention, there is provided a manufacturing method for a superconducting wire which has a fine line made of an oxide superconductor, comprising: a process for forming a fine line by stretching a metal pipe filled with an oxide superconductor; and a process for heating the fine line at a temperature which is higher than the melting point of the metal material constituting the metal pipe.

According to still another aspect of the present invention, there is provided a manufacturing method for a superconducting wire which has a fine line made of an oxide superconductor, comprising: a process for forming a fine line by stretching a metal pipe filled with a material for an oxide superconductor; a process for reacting the material so as to produce an oxide superconductor, and a process for heating the metal pipe at a temperature which is higher than the melting point of the metal material constituting the metal pipe.

DETAILED DESCRIPTION OF THE PREFERRED EMBODIMENTS

Figure 1:
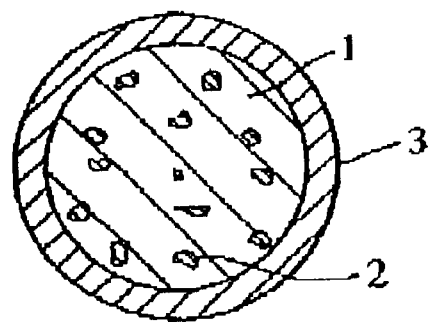
FIG. 1 is a schematic cross-sectional diagram illustrative of a superconducting wire according to the present invention.

According to the present invention, a metal material is dispersed in a fine line made of an oxide superconductor which constitutes a superconducting wire and the vacancies in the superconductor are filled with the metal material. This prevents a critical current from decreasing and improves mechanical strength and the like. Further, a conductive material is attached closely to the outer periphery of the fine line to maximize the function thereof as a stabilizer; therefore, the conductive material is not separated from the superconductor even when the superconducting wire is subjected to heat cycles. Thus, the critical temperature and critical current do not decrease during the manufacturing process, forming a highly practical superconducting wire having a high critical temperature and a high critical current.

The present invention will be described in detail by referring to preferred embodiments of the present invention.

The superconducting wire according to the present invention has a structure wherein a metal material such as silver or a silver alloy is mixed in a fine line composed of an oxide superconductor so as to prevent the critical current from decreasing, and a particular conductive material is attached to the outer periphery of the fine line. As the oxide superconductor constituting the present invention, any oxide superconductor may be used as long as it has a metal material dispersed therein; it may be in the form of a wire, a hollow tube, or a tape-shaped substrate or the like which is provided with an oxide superconductor on the surface thereof.

Especially desirable materials for the oxide superconductor include the following:

a material having a formula which is expressed by $Ln_aSr_bCu_{3-x}M_xO_c$, where $2.7 \leq a+b \leq 3.3$, $0.8 \leq a \leq 1.2$, $6 \leq c \leq 9$, and $0.05 \leq x \leq 0.7$; and Ln consists of at least one type of element or atomic group selected from the element group of Y element and lanthanoid element, and M consists of at least one type of element or atomic group selected from the element group of Ti, V, Ga, Ge, Mo, W, and Re;

a material having a formula which is expressed by $Ln_aCa_bSr_cCu_{3-x}M_xO_d$, where $2.7 \leq a+b+c \leq 3.3$, $0.8 \leq a+b \leq 2.1$, $6 \leq d \leq 9$, $0.05 \leq b \leq 1.1$, and $0.05 \leq x \leq 1.0$; and Ln consists of at least one type of element or atomic group selected from the element group of Y element and lanthanoid element, and M consists of at least one type of element or atomic group selected from the element group of Fe, Co, Ti, V, Ge, Mo, W, and Re;

a material having a formula which is expressed by $Ln_aCa_bSr_cBa_dCu_{2+e}O_{5+f}C_g$, where $a+b+c+d=3$, $0.2 \leq a \leq 0.8$, $0.2 \leq b \leq 1.0$, $0.5 \leq c \leq 2.2$, $0 \leq d \leq 1.6$, $0 \leq e \leq 0.8$, $0 < f < 2$, and $0.2 \leq g \leq 1$; and Ln consists of at least one type of element or atomic group selected from the element group consisting of Y element and lanthanide element;

a material having a formula which is expressed by $(Ln_{1-a}Ca_a)(Sr_{2-b}Ba_b)(Cu_{3-c}B_c)O_d$, where $0.1 \leq a \leq 0.5$, $0.7 \leq b \leq 1.7$, $0.1 \leq c \leq 0.5$, and $6.5 \leq d \leq 7.5$; and Ln consists of at least one type of element or atomic group selected from Y element and lanthanoid element excluding Ce and Tb; and a material which has essential component elements of Ln, M, Ba, Ti, Cu, and O (Ln consists of at least one type of element or atomic group selected from the element group of Y, La, Pr, Nd, Sm, Eu, Gd, Dy, Ho, Er, Tm, Yb, and Lu; and M consists of at least one type of element or atomic group selected from the element group of Ca and Sr); and the basic structure of which has both an octahedron or a pyramid pentahedron formed by Cu and O and an octahedron formed by Ti and O at the same time, the octahedron or the pyramid pentahedron and the octahedron being arranged in a two-dimensional manner.

It is needless to say that a very small amount of an impurity may be added to these materials.

In the superconducting wire according to the present invention, any conductive material may be used as the conductive material to be attached to the outer periphery of the oxide superconductor with a metallic material dispersed therein; especially desirable materials include a metal or a metal alloy such as Au, Al, Cu, Ni, Pd, Pt, Ti, Mo, W, Nb, and Mn.

By using the materials listed above and by dispersing a metallic material such as silver in the oxide superconductor, the critical current can be improved to a certain extent and the mechanical strength and the like can be also improved owing to the metal material that fills the gaps among the crystal grains. The metal material near the surface of the oxide superconductor provides good adhesion to the conductive material surrounding the outer periphery of the oxide superconductor, thus preventing the separation of the conductive material from the superconductor even when the superconducting wire is subjected to heat cycles.

The present invention also provides a manufacturing method for the superconducting wire described above. According to the manufacturing method, a superconductor or a material therefor is charged in a metal pipe and the metal pipe is subjected to wire drawing by dies, rolling, or the like. The oxide superconductor may be heated before, after or during the wire drawing to sinter it. The heating temperature should be 500 to 950 degrees centigrade. The resulting fine line is placed in a container such as a crucible and it is let pass through a melt of a conductive material having a melting point which is higher than that of the metal constructing the metal pipe. This causes a part of the metal of the pipe to melt into the oxide superconductor and the conductive material. By winding the fine wire using a roller or the like, the fine line is taken out of the melt of the conductive material, with the melted conductive material and pipe metal attached to the surface of the oxide superconductor.

The melt attached to the surface of the oxide superconductor is dispersed in the oxide superconductor because the metal remains in the melted state even when the conductive material solidifies, thus contributing to an improved critical current. The melt from the metal and conductive material, which has not dispersed in the oxide superconductor, remains on the surface of the oxide superconductor; therefore, the oxide superconductor can be attached without any gap when the conductive material solidifies even if the surface thereof is unsmooth. There is generally a possibility of the oxygen in the oxide superconductor being reduced while the fine line is going through the melt of the conductive material. According to the present invention, however, the eliminated oxygen is captured in the silver or silver alloy; therefore, even if the conductive material is the one that does not allow oxygen to permeate, the superconductivity can be restored by making use of the oxygen taken into the metal by performing heat treatment.

The means for producing the conductive material is not limited to the one wherein the fine line is allowed to pass through the melt. For instance, in the case of a material like W which has a high melting point, not only the metal constituting the pipe but also the oxide superconductor melt or decompose in some cases. In the case of a material like Al which has a low melting point, a metal such as silver does not melt even when it passes through the melt. In such a case, the metal constituting the pipe is melted before the conductive material is attached by an appropriate means according to the type of material used. Methods for attaching the conductive material include the one whereby the conductive material is applied and subjected to heat treatment, the one utilizing vacuum deposition, and the one utilizing chemical deposition.

The metal pipe may be provided with a plurality of small holes so as to permit easy reaction with oxygen during the heat treatment in an oxygen atmosphere, or it may be subjected to HIP treatment or the like after wire drawing or after the conductive material is solidified. It is needless to say that an insulating material may be attached to the surface of the conductive material. There is a possibility of the solving of the conductive material and the metal when the conductive material passes through the melt; however, no problem occurs according to the present invention even if they solve. An appropriate atmosphere and the like for the wire drawing, heating, winding, and delivery should be selected according to the type of material used.

The following describes the present invention by referring to specific embodiments.

First Embodiment

FIG. 1 is a schematic cross-sectional diagram illustrative of a superconducting wire according to the present invention. Reference numeral 1 denotes an oxide superconductor. Reference numeral 2 denotes silver or a silver alloy, which has been scattered in the oxide superconductor, and/or a material added for pinning; they are shown in a larger size than they really are. The silver or the silver alloy need not be scattered evenly inside the superconductor; it may be segregated in the vicinity of the surface of the oxide superconductor. Reference numeral 3 denotes a conductive material.

The oxide superconductor used for the superconducting wire according to the present invention is generally produced by heat treatment. The density of a sintered compact is frequently lower than a theoretical density. When the sintered compact is processed into a superconducting wire, therefore, vacancies are generated in the superconducting wire. The vacancies lead to a lower critical current of the superconducting wire. To solve this problem, silver or a silver alloy is melted and filled in the vacancies and further, the silver or the silver alloy is dispersed in the oxide superconductor for the purpose of pinning by making use of the filling temperature. A conductive material is attached as the stabilizing material to the outer periphery of the superconductor.

The superconducting wire in accordance with the present invention may be manufactured by any method: for example, a silver pipe is filled with oxide superconductor powder and rolled to be formed into a wire. The wire is then heated to a temperature above 960 degrees centigrade which is the melting temperature of silver. This heating causes the silver to fill the gaps among the crystal grains of the oxide superconductor or to be scattered in the oxide superconductor. The conductive material is attached to the outer periphery of the oxide superconductor at the same time as or after the melting of the silver, thereby producing the superconducting wire. There is no particular established way to attach the conductive material; several methods may be employed: for example, the oxide superconductor is allowed to pass through the melt of a conductive material, or various deposition processes may be used, or an organometal may be applied and subjected to heat treatment. A suitable method for attaching the conductive material should be selected depending on the type of materials used.

As shown in FIG. 1, in the superconducting wire according to the present invention, silver or a silver alloy is scattered in the oxide superconductor to improve the critical current density. Further, the melt of the silver or the silver alloy is also present in vacancies and the recessed spots near the surface of the oxide superconductor, thus providing good adhesion to the conductive material attached around the oxide superconductor.

There is no particular restrictions on the combination of the materials employed for the present invention. In this embodiment, $Y_2O_3$, $SrCO_3$, $WO_3$, and $CuO$ were mixed so as to produce 10 wt % of $SrY_2O_4$ with respect to $YSr_2Cu_{2.8}W_{0.2}O_y$, then the mixture was subjected to heat treatment at 950 to 1400 degrees centigrade to produce the oxide superconductor. As the conductive material to be attached around the oxide superconductor, Cu was used. The same combination of the materials was employed for other embodiments as well as the first embodiment to produce the superconducting wire in accordance with the present invention.

The superconducting wire according to this embodiment obtained by using the aforesaid materials and by melting and dispersing the silver as described above showed a critical current density of approximately 10,000 $A/cm^2$(5K). In contrast to this, the critical current density, which was obtained when the same oxide superconductor was employed but no silver was melted and dispersed, was approximately 2,000 $A/cm^2$, which is significantly lower than that of this embodiment.

Moreover, the superconductive characteristics of the superconducting wire in accordance with this embodiment remained unchanged after winding the superconducting wire by a roller having a diameter of 30 cm, whereas the comparison example, which had no silver melted and dispersed, showed a drop in conductivity to 1/100 to 1/1,000 after winding the wire by the same roller. This proves that the superconducting wire in accordance with the present invention provides high mechanical strength and also high critical current density.

Second Embodiment

Figure 3:
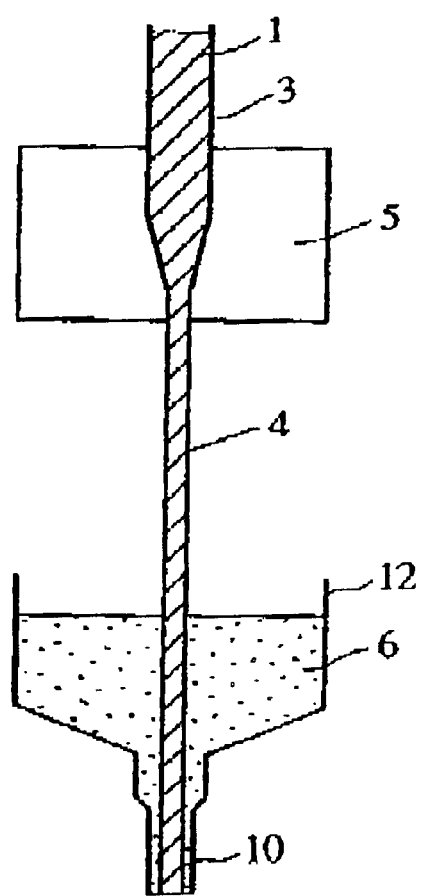
FIGS. 3, 4, 5, and 6 are schematic diagrams illustrative of specific examples of the manufacturing method according to the present invention.

FIG. 3 shows the conceptual diagram of the manufacturing method for the superconducting wire. First, a silver pipe is filled with an oxide superconductor, then it is formed into a silver sheath wire by using a plurality of dies 5 (FIG. 3 shows only one die). In this case, the superconductor was charged in the silver pipe measuring 8 mm in outside diameter and 6 mm in inside diameter to produce a fine line 4 having an outside diameter of 0.8 mm. Reference numeral 6 denotes a copper melt in a crucible, the melt being produced by a heating device which is not shown. The temperature of the copper melt is maintained at 1,100 degrees centigrade. The silver sheath wire obtained as stated above is placed in and let pass through the copper melt 6. The majority of the silver is melted and dispersed in the oxide superconductor although a part of the silver mixes with the copper melt 6 since the melting point of the silver is 960 degrees centigrade. The wire is wound by a roller (not shown) to take the wire, with the copper attached to the surface thereof, out of the crucible. A wire 10, which has been taken out of the crucible, is cooled. The copper, which has a higher melting point and which is on the outer periphery of the oxide superconductor, starts solidifying first, whereas the inside silver solidifies more slowly than the copper. This difference in solidifying speed enables the silver to be scattered into the gaps and crystals of the oxide superconductor. The wire 10 is cooled until the solidification of the silver is completed, then the finished superconducting wire is wound using the roller (not shown).

The critical current of the superconducting wire of the second embodiment thus produced is $10^4$ A/cm$^2$ or more regardless of the composition of the superconductor materials used. No change in the superconductive characteristics was observed even when a roller having a diameter of about 300 mm was used to wind the superconducting wire. The critical current of the silver sheath wire with no silver melted was about $10^2$ A/cm$^2$. The oxide superconductor broke when the wire was wound using the roller having the 300 mm diameter. The superconducting wire in accordance with the present invention showed almost no change in the critical temperature of the superconductor before it was charged in the silver pipe and after it was formed into the superconducting wire.

Third Embodiment

Figure 4:
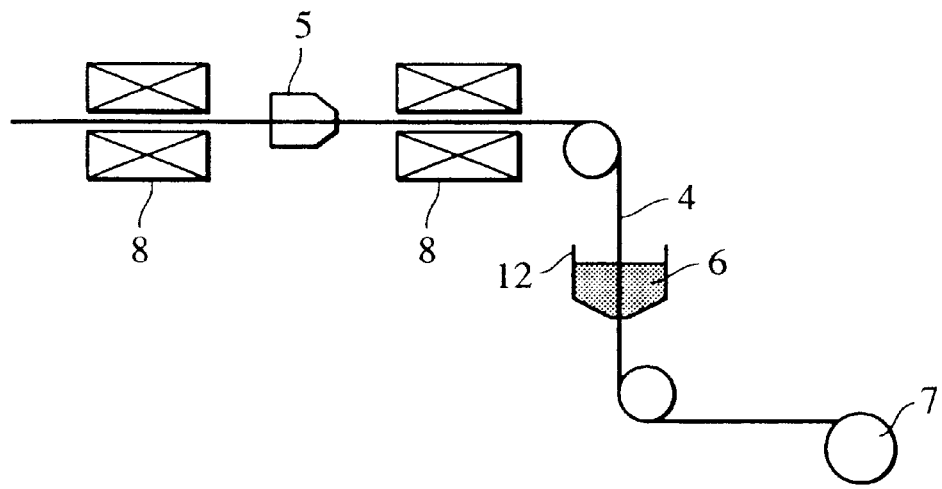

FIG. 4 shows the conceptual diagram of the manufacturing method for the superconducting wire of the third embodiment. First, a silver pipe with a hole having a diameter of approximately 0.1 to 0.5 mm is filled with materials for producing the superconductor and it is formed into a wire having a diameter of 1 mm by using the die 5. At this time, as shown in FIG. 4, the silver pipe is heated by heaters 8 before and after it is drawn by the die so as to produce the oxide superconductor. In general, a carbonate or nitrate, or an oxide of a constituent metal element is used as the material for producing the oxide superconductor. The hole formed in the silver pipe makes it possible to supply oxygen to the central part of the silver pipe and also to discharge a gas such as carbon dioxide which is generated when the materials are decomposed. Thus, according to this embodiment, a superconductor with good characteristics can be produced by the heat treatment using the heaters 8.

The wire 4 thus obtained is placed in a crucible to let it go through melted gold 6. The temperature of the gold melt 6 is maintained at 1,065 to 1,080 degrees centigrade. Since the melting point of silver is 960 degrees centigrade, the silver melts and disperses in the oxide superconductor when the wire 4 is passed through the gold melt 6. When the wire is pulled out of the crucible, it has the gold on the surface thereof. The gold and silver are partially mixed before they solidify; the mixing ratio can be controlled by the time during which the wire is in contact with the gold melt 6 and the winding speed. There should be no problem as long as the mixing ratio stays constant to a certain level throughout the wire which has been wound.

The superconducting wire of the third embodiment thus produced exhibits high resistance to mechanical deformation; it can be produced in a length of about 1,000 m even when the roller 7 has a diameter of 200 mm.

Fourth Embodiment

Figure 5:
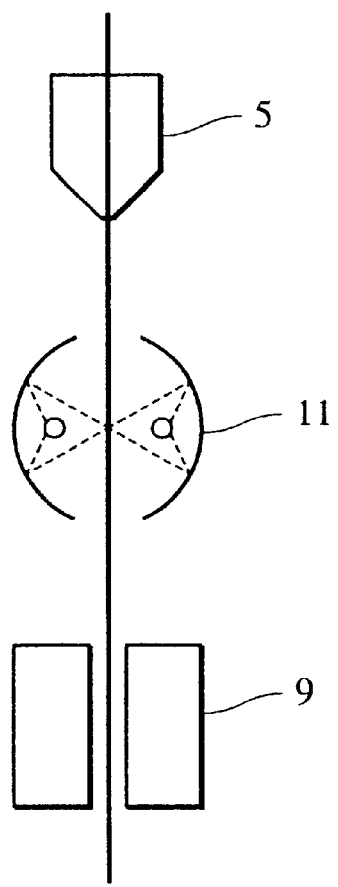

FIG. 5 shows the conceptual diagram of the manufacturing method for the superconducting wire according to the fourth embodiment. A pipe made of an alloy of silver with 3 wt % of palladium added is filled with an oxide superconductor and formed into a desired sheath wire by using the die 5. The sheath wire is then heated by the heating device 11 so as to melt the silver alloy. After the melted alloy solidifies, the conductive material is formed on the surface of the sheath wire by using a thin film forming device 9 to make the superconducting wire of this embodiment. Any heating device may be used for the heating device 11 as long as it is capable of heating the sheath wire to a temperature at which the silver alloy is melted; infrared rays were concentrated for heating in this embodiment. Likewise, any device may be used for the thin film forming device 9 as long as it is capable of forming a conductive material of the desired thickness; organopalladium was applied and subjected to heat treatment to produce a palladium film in this embodiment.

The superconducting wire according to this embodiment thus produced exhibits extremely good adhesion between the silver and palladium, minimizing the chance of cracking or the like when the wire is subjected to mechanical deformation. Further, the silver and palladium dispersed in the superconductor have caused the critical current density to increase to a value which is two orders of magnitude or more larger than that of the superconducting wire with no dispersed silver alloy.

Fifth Embodiment

Figure 6:
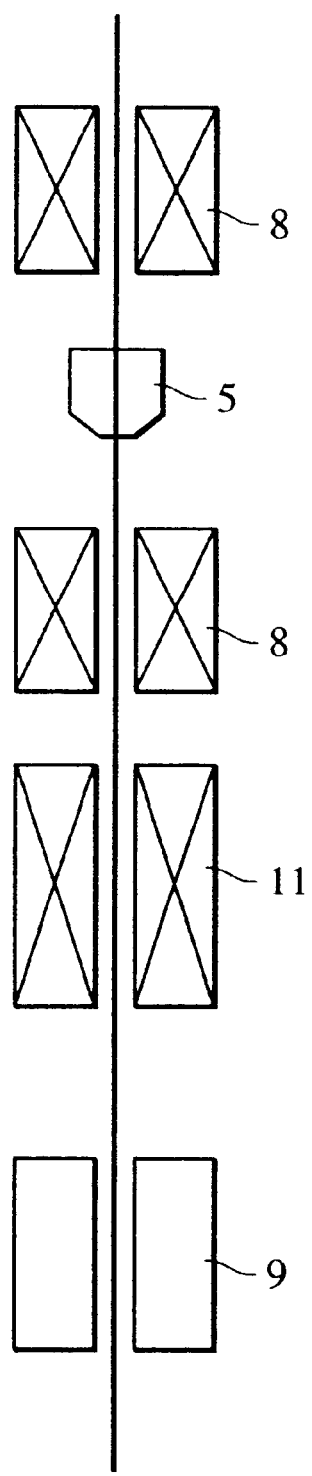

FIG. 6 is the conceptual diagram illustrative of the manufacturing method for the superconducting wire according to the fifth embodiment. In this embodiment, a mixture material, i.e. the composite material, for the oxide superconductor was charged in a silver alloy pipe which is composed of silver with 1 wt % of magnesium added and which is provided with a plurality of small holes. Before the wire drawing by the die 5, the silver alloy pipe was heated by the heater 8 to remove the gases including the cracked gas, moisture, etc. discharged from the material, thus producing the superconductor of the fifth embodiment. The silver alloy pipe filled with the produced oxide superconductor was drawn to a desired size by the die 5 before it was cooled to room temperature. In this embodiment, ten different dies were used for the wire drawing and the temperature was decreased from 500 to 100 degrees centigrade as the wire diameter decreased, then heat treatment was carried out again by the heater 8. The atmosphere for the heat treatment before and after the wire drawing by the dies 5 is selected according to the type of the superconductor employed. The conditions for the heat treatment are set so that the oxide superconductor is furnished with the best possible superconductive characteristics by the heat treatment carried out before and after the wire drawing carried out by the dies 5. In this embodiment, the heat treatment was performed at 930 degrees centigrade.

After that, the wire formed by the drawing was heated by the heating device 11 to melt the silver alloy on the surface. In this embodiment, an electric furnace having a kanthal super wire as the heating element was used as the heating device 11. After the melted silver alloy was scattered in the oxide superconductor, the oxide superconductor was cooled and the conductive material was formed on the surface thereof by the thin film forming device 9. In this embodiment, the conductive material was attached by passing the wire through an aluminum melt in a crucible.

The superconducting wire according to the fifth embodiment thus produced provided high resistance to mechanical deformation and had a critical current density which is two orders of magnitude larger than that of the superconducting wire with no silver alloy melted and dispersed.

Sixth Embodiment

Figure 2:
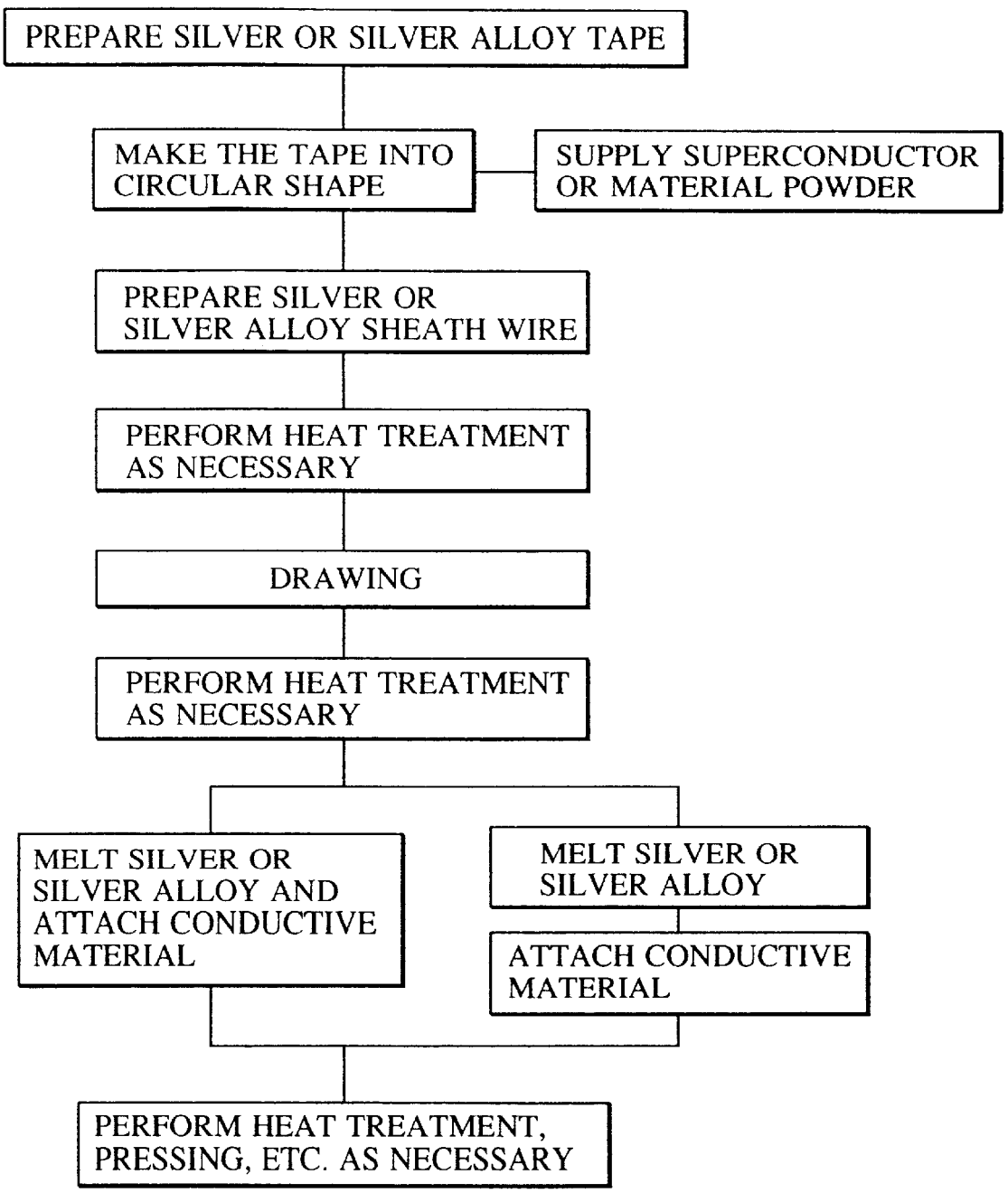
FIG. 2 is a flowchart illustrative of a manufacturing method according to the present invention.

FIG. 2 shows the flow of the manufacturing method in accordance with the present invention. First, a silver or silver alloy flat tape is prepared and bent so that the cross-sectional area thereof is U-shaped. Oxide superconductor powder or a material mixture for the oxide superconductor powder is supplied to the inner side of the U-shaped tape, then it is formed so that the cross-sectional area is O-shaped. At this time, the both ends of the silver or silver alloy tape may be in contact or overlapped or they may even have a gap, provided the powder inside does not fall. After that, the tape is subjected to wire drawing by appropriate figuring. Heat treatment is performed before and after or during the wire drawing as necessary. The wire is then led into the crucible to melt the silver or silver alloy thereby to disperse the silver or silver alloy in the superconductor, and the conductive material, which serves as the stabilizer, is attached to the surface of the superconductor. The melting of the silver or silver alloy and the attaching of the conductive material may be done at the same time or in succession; they were conducted at the same time in the sixth embodiment.

FIG. 3 shows the principle for melting the silver or silver alloy and attaching the conductive material at the same time. Reference numeral 1 denotes the oxide superconductor powder charged in the silver or silver alloy tape 3 which has been formed to have the O-shaped cross section. Reference numeral 5 indicates the die. The drawing shows only one cycle of process; however, a plurality of dies may be used as necessary to implement a plurality of regressive process cycles. Reference numeral 4 indicates the material wire which has been formed into a desired shape by the method stated above; the wire is led into the crucible 12 to let it pass through the melt 6 of the conductive material. This causes the silver or silver alloy on the surface of the superconductor to melt. The majority of the melted silver or silver alloy moves into the vacancies or the like in the superconductor although a part thereof is mixed with the melt 6.

As a result, when the wire is pulled out of the crucible 12 holding the melt 6 of the conductive material, the conductive material is applied to the surface of the wire. At this time, since the melting point of the conductive material is higher than that of the silver or the like, the conductive material solidifies first, and then the silver or the silver alloy dispersed in the superconductor solidifies. Thus, the silver or the silver alloy dispersed and solidified in the oxide superconductor enables a higher critical current density. Moreover, the vacancies in the oxide superconductor and the recessed spots near the surface thereof are also filled primarily with the melt of the silver or the silver alloy, thus ensuring good adhesion of the conductive material attached to the outer periphery of the oxide superconductor. All steps including the step for making the silver or silver alloy tape into a pipe and the step for supplying the superconductor powder can be implemented in succession by using a supplying reel and a winding reel (not illustrated in FIG. 3).

There is no particular restrictions on the combination of the materials used in the present invention. In the sixth embodiment, $Y_2O_3$, $SrCO_3$, $WO_3$, and CuO were mixed so as to produce 10 wt % of $SrY_2O_4$ with respect to $YSr_2Cu_{2.8}W_{0.2}O_y$, then the mixture was subjected to heat treatment at 950 to 1400 degrees centigrade to produce the oxide superconductor. As the conductive material wrapping around the oxide superconductor, Cu was used. The same combination of the materials was employed for other embodiments as well as the sixth embodiment to produce the superconducting wire.

The superconducting wire of this embodiment obtained by using the aforesaid materials and by melting and dispersing the silver as described above exhibited a critical current density of approximately 10,000 $A/cm^2$(5K). In contrast to this, the critical current density, which was obtained when the same oxide superconductor was employed but no silver was melted and dispersed, was approximately 2,000 $A/cm^2$, which is significantly lower than that of this embodiment.

Furthermore, the superconductive characteristics of the superconducting wire in accordance with this embodiment remained unchanged after winding the superconducting wire by the roller having the 30 cm diameter, whereas the comparison example, which had no silver melted and dispersed, showed a drop in conductivity to 1/100 to 1/1,000 after winding the wire by the same roller. This proves that the superconducting wire in accordance with the present invention provides high mechanical strength and also high critical current density.

Seventh Embodiment

FIG. 3 shows the conceptual diagram illustrative of the process for melting the silver and attaching the conductive material in the seventh embodiment. First, a silver sheath material which has an oxide superconductor therein and which has been formed into a pipe is processed into a fine line by a plurality of dies 5 (only one die is shown in FIG. 3). In this embodiment, the silver sheath material measuring 8 mm in outside diameter and 6 mm in inside diameter was formed into the fine line 4 having an outside diameter of 0.8 mm. Reference numeral 6 denotes a copper melt in the crucible 12 produced by melting copper by a heating device which is not shown; the temperature of the melt is maintained at 1,090 degrees centigrade. The silver sheath material obtained as stated above is placed in the copper melt 6 and let pass through the copper melt 6. At this time, the majority of the silver is melted and dispersed in the oxide superconductor although a part of the silver mixes with the copper melt 6 since the melting point of the silver is 960 degrees centigrade. Then, the wire is wound by a roller, not shown, to take the wire, which has the copper attached to the surface thereof, out of the crucible 12. The wire 10 taken out of the crucible 12 starts solidifying from the outer periphery; it is cooled until the solidification of the silver inside is completed before the finished superconducting wire is wound using the roller which is not shown. Oxygen may be blown into the melted silver so that the oxide superconductor with oxygen reduced may restore the superconductive characteristics. Heat treatment may be performed again after the silver on the outer periphery solidifies.

The critical current of the superconducting wire thus produced was $10^4$ $A/cm^2$ or more regardless of the composition of the superconductor material used and no change in the superconductive characteristics was observed even when the diameter of the roller winding the superconducting wire was about 300 mm. A wire which has the same performance was obtained when a silver tape with a hole having a diameter of 0.5 mm or less was employed to make the superconducting wire in the same manner as stated above.

When, however, the speed for winding the wire was too high for the silver of the silver tape to fully melt, the critical current of the resulting wire was about $10^2$ $A/cm^2$ and the observation of the cross section of the obtained wire revealed the presence of a gap over the whole surface between the silver and the superconductor. Such a gap was not observed in the superconducting wire according to the present invention. This demonstrates that, according to the present invention, the silver melts and fully covers the irregular surface of the superconductor, thereby ensuring close contact with the conductive material on the outer periphery.

Eighth Embodiment

FIG. 4 is the conceptual diagram showing the manufacturing method for the superconducting wire of the eight embodiment. First, a silver tape with a hole of a diameter of about 0.1 mm to about 0.5 mm is formed into a U-shape by continuous rolling. The materials for producing the superconductor are supplied to the recessed section of the tape, then the tape is shaped into a pipe by further rolling. The wire material is formed into a wire having a diameter of 1 mm by the die 5. At this time, as shown in FIG. 4, the silver pipe is heated before and after the die to make the oxide superconductor. In general, a carbonate or nitrate, or an oxide of a constituent metal element is used as the material for making the oxide superconductor. The hole formed in the silver pipe makes it possible to supply oxygen to the central part of the silver pipe and also to discharge a gas such as carbon dioxide which is generated when the materials are decomposed. Thus, according to this embodiment, a superconductor with good characteristics can be produced by the heat treatment using the heaters 8. The wire 4 thus obtained is placed in the crucible 12 to let it go through the melted gold 6. The temperature of the gold melt 6 is maintained at 1,065 to 1,080 degrees centigrade. Since the melting point of silver is 960 degrees centigrade, the silver melts and disperses in the oxide superconductor when the wire 4 is passed through the gold melt 6. When the wire is pulled out of the crucible 12, it has the gold on the surface thereof. The gold and silver are partially mixed before they solidify; the mixing ratio can be controlled by the time during which the wire is in contact with the gold melt 6 and the winding speed.

The superconducting wire thus produced exhibits high resistance to mechanical deformation; it can be produced in a length of about 1,000 m even when the diameter of the roller 7 is 200 mm.

Ninth Embodiment

FIG. 5 is the conceptual diagram illustrative of the manufacturing method for the superconducting wire of the ninth embodiment. A tape made of an alloy of silver with 3 wt % of palladium added is made into a pipe and an oxide superconductor is charged therein, then the pipe is formed into a desired sheath wire by using the die 5. The sheath wire is then heated by the heating device 11 so as to melt the silver alloy. After the melted alloy solidifies, the conductive material is formed on the surface of the sheath wire by using the thin film forming device 9 to make the superconducting wire. Any heating device may be used for the heating device 11 as long as it is capable of heating the sheath wire to a temperature at which the silver alloy is melted; infrared rays were concentrated for the heat treatment in this embodiment. Likewise, any device may be used for the thin film forming device 9 as long as it is capable of forming a conductive material of the desired thickness; organopalladium was applied and subjected to heat treatment to produce a palladium film in the ninth embodiment.

The superconducting wire according to this embodiment thus produced exhibits extremely good adhesion between the silver and palladium, minimizing the chance of cracking or the like when the wire is subjected to mechanical deformation. Further, the silver and palladium dispersed in the superconductor caused the critical current density to increase to a value which is two orders of magnitude or more larger than the critical current density of the superconducting wire with no dispersed silver alloy.

Tenth Embodiment

FIG. 6 is the conceptual diagram showing a part of the manufacturing method for the superconducting wire according to the tenth embodiment. In this embodiment, the oxide superconductor was charged in a silver alloy tape, which is composed of silver with 1 wt % of magnesium added and which is provided with a plurality of small holes, while shaping the tape into a pipe. Before the wire drawing by the die 5, the silver alloy pipe was heated by the heater 8 to remove the gases including the cracked gas, moisture, etc. discharged from the material, thus producing the superconductor. The silver alloy pipe filled with the produced oxide superconductor was drawn to a desired size by the die 5 before it was cooled to room temperature. In the present invention, the wire drawing was carried out at 500 to 100 degrees centigrade, then heat treatment was implemented again by the heater 8. The atmosphere for the heat treatment before and after the wire drawing by the die 5 is selected according to the type of the superconductor employed.

After that, the wire formed by the drawing was heated by the heating device 11 to melt the silver alloy on the surface. In this embodiment, the electric furnace employing the kanthal super wire as the heating element was used as the heating device 11. After the melted silver alloy was scattered in the oxide superconductor, the oxide superconductor was cooled and the conductive material was formed on the surface thereof by the thin film forming device 9. In this embodiment, the conductive material was attached by passing the wire through the aluminum melt in the crucible. The heat treatment prior to the wire drawing step may be omitted if the oxide superconductor powder is supplied to the silver alloy tape.

The superconducting wire thus produced provided high resistance to mechanical deformation and had a critical current density which is two orders of magnitude larger than that of the superconducting wire with no silver alloy melted and dispersed.

Thus, according to the present invention, there is provided a highly reliable, practical superconducting wire which is capable of fully displaying the characteristics of an oxide superconductor employed for the superconducting wire without incurring a drop in the critical temperature or the critical current during the manufacturing process and which also provides high resistance to mechanical deformation.

What is claimed is:

1. A manufacturing method for a superconducting wire which has a fine line of an oxide superconductor comprising:
   a process for forming a fine line by drawing a metal pipe filled with an oxide superconductor;
   a process for heating said fine line at a temperature which is higher than the melting point of a metal material constituting said metal pipe so that a melt of said metal material fills gaps among crystal grains of said oxide superconductor; and
   a process for solidifying the melt of said metal material that fills the gaps.

2. A manufacturing method for the superconducting wire according to claim 1, wherein said metal pipe has a plurality of small holes.

3. A manufacturing method for the superconducting wire according to claim 1, wherein said metal pipe is formed by wrapping an oxide superconductor with a metal tape.

4. A manufacturing method for the superconducting wire according to claim 3, wherein said metal tape has a plurality of small holes.

5. A manufacturing method for the superconducting wire according to any of claims 1 to 4, wherein the outer periphery of said fine line is coated with a conductive material.

6. A manufacturing method for the superconducting wire according to any of claims 1 to 4, wherein the process for heating said fine line has a step for letting said fine line pass through a melt of a conductive material having a melting point which is higher than that of a metal material constituting said metal pipe.

7. A manufacturing method for a superconducting wire which has a fine line of an oxide superconductor comprising:
   a process for forming the fine line by drawing a metal pipe filled with materials for the oxide superconductor;
   a process for causing said materials to react so as to produce the oxide superconductor;
   a process for heating said fine line at a temperature which is higher than the melting point of a metal material constituting said metal pipe.

8. A manufacturing method for the superconducting wire according to claim 7, wherein said process for causing said materials to react so as to produce the oxide superconductor has a step for heating said materials to a reaction temperature before and after the process for forming said fine line.

9. A manufacturing method for the superconducting wire according to claim 7, wherein said metal pipe has a plurality of small holes.

10. A manufacturing method for the superconducting wire according to claim 7, wherein said metal pipe is formed by wrapping the materials for the oxide superconductor with the metal tape.

11. A manufacturing method for the superconducting wire according to claim 10, wherein said metal tape has a plurality of small holes.

12. A manufacturing method for the superconducting wire according to any of claims 7 to 11, further comprising a process for coating the outer periphery of said fine line with the conductive material.

13. A manufacturing method for the superconducting wire according to any of claims 7 to 11, wherein the process for heating said fine line has a step for letting said fine line pass through the melt of the conductive material having the melting point which is higher than that of the metal material constituting said metal pipe.

14. A manufacturing method for a superconducting wire which has a fine line of an oxide superconductor comprising the steps of
   forming a fine line by drawing a metal pipe filled with an oxide superconductor;
   heating the fine line at a temperature which is higher than the melting point of a metal material constituting the metal pipe; and
   letting said fine line pass through a melt of a conductive material having a melting point which is lower than that of the metal constituting said metal pipe.

15. A manufacturing method for a superconducting wire according to claim 14, wherein said metal pipe is formed by wrapping an oxide superconductor with a metal tape.

16. A manufacturing method for a superconducting wire according to claim 15, wherein said metal tape has a plurality of small holes.

17. A manufacturing method for a superconducting wire according to claim 14, wherein said conductive material is aluminum.

18. A manufacturing method for the superconducting wire according to claim 1, wherein said metal material is silver or a silver alloy.

* * * * *